(12) United States Patent
Lin et al.

(10) Patent No.: US 6,355,960 B1
(45) Date of Patent: Mar. 12, 2002

(54) ESD PROTECTION FOR OPEN DRAIN I/O PAD IN INTEGRATED CIRCUIT WITH PARASITIC FIELD FET DEVICES

(75) Inventors: Geeng-Lih Lin, Hsin-Chu; Ming-Dou Ker, Hsinchu, both of (TW)

(73) Assignee: Vanguard International Semiconductor Corporation, Hsin-Chu (TW)

(*) Notice: Subject to any disclaimer, the term of this patent is extended or adjusted under 35 U.S.C. 154(b) by 0 days.

(21) Appl. No.: 09/664,420

(22) Filed: Sep. 18, 2000

(51) Int. Cl.⁷ .............................................. H01L 29/72
(52) U.S. Cl. ...................... 257/355; 257/401; 257/409; 257/496
(58) Field of Search ................................ 257/355, 401, 257/409, 496

(56) References Cited

U.S. PATENT DOCUMENTS 5,237,395 A * 8/1993 Lee ............................ 257/355
5,532,178 A 7/1996 Liaw et al. .................... 437/57
5,689,133 A 11/1997 Li et al. ....................... 257/361

* cited by examiner

Primary Examiner—Edward Wojciechowicz
(74) Attorney, Agent, or Firm—George O. Saile; Stephen B. Ackerman; William Robertson

(57) ABSTRACT

An open drain FET driver circuit at an input-output pad of a semiconductor chip and a frame of the same conductivity type as the drain and source diffusions of the driver is formed around the driver (or partly around the driver). The frame is connected to Vdd and forms the diffusion for the Vdd end of a field FET. The drain of the driver forms the diffusion for the pad end of this field FET and the pad to Vdd FET breaks down in response to an ESD voltage between the pad and Vdd and provides a path for ESD current that the open drain driver itself does not provide. Optionally, a second field FET is formed between the source of the driver FET and the frame and this FET conducts an ESD current between the pad and Vdd in series with the driver. With this cell array structure, the junction capacitance which the ESD protection devices contribute to the pad can be significantly reduced for high speed I/O applications.

18 Claims, 4 Drawing Sheets

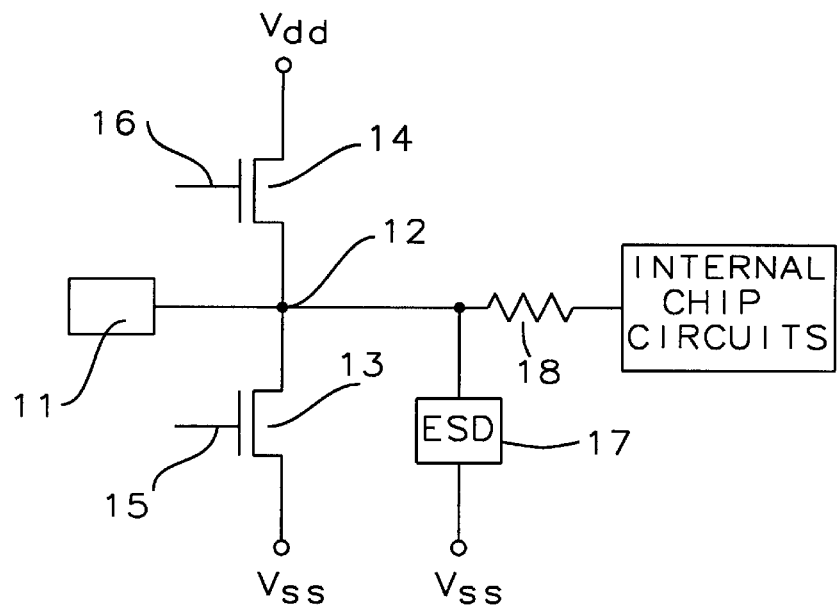
FIG. 1 - Prior Art
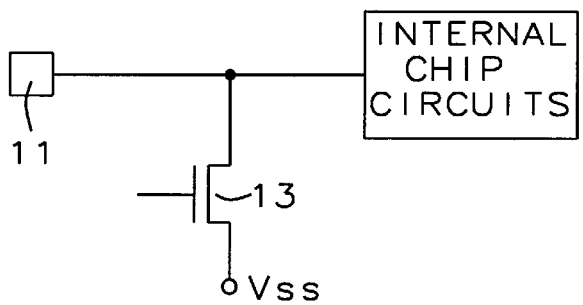
FIG. 2 - Prior Art
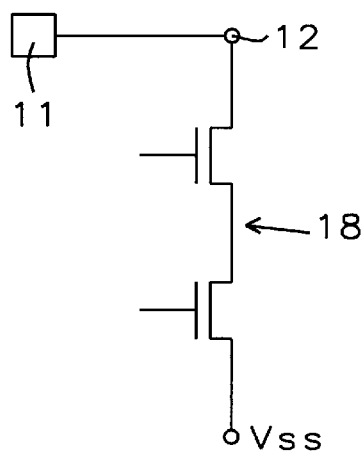
FIG. 3 - Prior Art

ESD PROTECTION FOR OPEN DRAIN I/O PAD IN INTEGRATED CIRCUIT WITH PARASITIC FIELD FET DEVICES

RELATED APPLICATIONS

An application for "ESD Protection Device for Open drain I/O Pad in Integrated Circuits with a Merged Layout Structure", (docket VIS88-031) assigned to the assignee of this invention, has a related disclosure.

FIELD OF THE INVENTION

This invention relates generally to circuits for semiconductor chips and more specifically to circuits with improved protection against electrostatic discharge (ESD) stress at an input-output pad of the chip.

BACKGROUND OF THE INVENTION

ESD voltages are a familiar problem for developers of semiconductor chips for integrated circuit devices. An ESD voltage appears at an input-output pad of a chip when, for example, a voltage is picked up by a conductor that runs between the pad and a circuit node external to the chip. A pad is a small region on a chip were external conductors can be attached to the chip. A pad is usually connected to the input of an input buffer circuit or to the output of a driver circuit or to both.

One familiar driver circuit is an inverter formed by two NMOS FETs. An upper FET is connected to conduct between the output pad and Vdd and a lower FET is connected to conduct between the output pad and Vss. (Vss and Vdd are the usual designations for the power supply terminals of the chip.) The gates of the FETs receive binary signals that in one state turn off the lower FET and turn on the upper FET to pull the output pad up. In the other binary state, the signals at the gates of the FETs turn off the upper FET and turn on the lower FET and pull the output pad down.

ESD protection device limits the ESD voltage to a value that will not damage the internal circuits of the chip that are connected to the pad. An ESD protection device creates a low resistance current path that clamps the voltage at the pad to a safe value. Sometimes a resistor is connected in the signal path between the pad and the protection device to further isolate the pad voltage from other components.

An ESD current path can be established in response to a high ESD voltage when a semiconductor junction breaks down. This junction breakdown occurs because the voltage on the ESD side of the junction has reached a break down value with respect to the voltage on the other side of the junction. The voltage on the other side of the junction is commonly established by the power supply nodes, Vss and Vdd, and the ESD current path ordinarily It includes Vss or Vdd. The ESD current can also flow in a path between Vss and Vdd.

The driver circuit that has just been described can be used for ESD protection. When a high positive voltage appears at the pad with respect to Vss, the substrate-drain junction of the lower FET is reverse biased and it breaks down at a predetermined voltage. In a similar way, the upper FET provides protection against an ESD voltage that appears between the pad and Vdd. These circuits provide protection for an ESD voltage of either polarity.

Commonly, the drain diffusion is made larger to handle the ESD current. The larger drain increases the capacitance at the pad and in this way slows the rise and fall of logic pulses that appear at the pad in the normal operation of the chip.

Sometimes an open drain driver is used with an input-output pad. This driver circuit is like the circuit just described except that it does not have the upper FET: in normal operation the driver output is pulled down in the way described but it is pulled up by the external circuits that are connected to the pad. An open drain driver circuit does not in general provide a suitable path for an ESD current to Vdd.

The prior art has suggested many other devices for creating this path for ESD currents at the pad.

SUMMARY OF THE INVENTION

One object of our invention is to provide improved ESD protection for the internal circuits of a chip that are connected to a pad having an open drain driver circuit. A more specific object is to provide protection against an ESD voltage that appears between the pad and power supply terminal Vdd.

We provide a first field FET connected between the pad and Vdd. As is conventional, the field FET has a source diffusion, a drain diffusion, an intervening channel, and a field oxide over the channel. The field FET does not have a gate electrode. It turns on when a break down occurs at the reverse biased junction of the drain diffusion or the source diffusion.

We also provide, optionally, a second field FET that conducts an ESD current (of either polarity) between Vss and Vdd. When an ESD voltage appears between the pad and Vdd, the driver conducts between the pad and Vss and the second field FET conducts between Vss and Vdd.

The driver FET comprises two parallel FETs formed symmetrically about a common (shared) drain diffusion, as in the related application.

The first field FET is formed by the drain diffusion of the open drain driver and a frame that surrounds (or partly surrounds) the driver. The frame is of the same conductivity type as the drain and source diffusions of the driver, and it is connected to Vdd. The drain of the driver forms the diffusion for the pad end of the first field FET and the frame forms the diffusion for the Vdd end.

A second field FET is formed similarly by the frame and the source diffusion of the driver, and it conducts between the source diffusion at Vss and the frame at Vdd.

In one embodiment, the frame around the driver FET is rectangular or square and several driver FETs are formed in a row and column array and connected to conduct in parallel to provide a selected output current at the pad.

In one embodiment, the frame is a partial frame that borders the drain and source diffusions of the driver FET along opposite sides of the driver FET structure and thereby forms only the first field FET between the pad and Vdd.

Other features of the invention will appear in the description of my preferred embodiment.

THE DRAWING

FIG. 1 is a schematic drawing of a conventional driver circuit and its ESD protection devices.

FIG. 2 is a schematic drawing of a conventional open drain driver circuit.

FIG. 3 is a schematic drawing similar to FIG. 2 showing another open drain driver circuit with stacked FETs.

THE PREFERRED EMBODIMENT

Introduction—The Driver of FIG. 1

Figure 4:
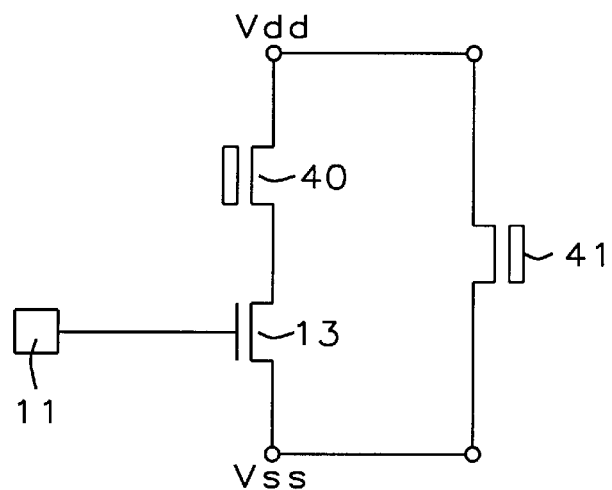
FIG. 4 is a schematic diagram of a preferred embodiment of an open drain circuit with the ESD protection structure of this invention.

FIG. 1 shows an input-output pad 11 that is to be protected from ESD voltages that may appear for example on the wires that connect this pad to external circuit nodes (not shown). Pad 11 is connected to internal circuits of the chip, and it may have a conventional input buffer circuit that is not shown in the drawing.

Pad 11 is also connected to the output 12 of an NMOS inverter formed by a lower FET 13 and an upper FET 14. The source of lower FET 13 is connected to potential point Vss and the drain of FET 14 is connected to potential point Vdd. The drain of FET 13 and the source of FET 14 are connected together to form the output 12. The gate electrodes 15 and 16 of FETs 13 and 14 are connected to receive signals that turn one of the FETs on and the other off to pull the output up to Vdd or down to Vss, depending on which FET has been turned on. (The signal sources are conventional and are not shown in the drawing.)

FIG. 1 also shows an ESD device 17 connected between pad 11 and Vss. This device is shown as a functional block because it can represent any known ESD protection device added to this prior art circuit. A resistor 18 is optionally connected between pad 11 and the common connection node of ESD device 17 and the internal circuits. When the preferred embodiments have been described, it will be apparent that the invention will be useful for protecting various known pad driver circuits.

The Open Drain Driver—FIGS. 2 and 3

FIG. 2 shows a conventional open drain driver. The pad 11 and the lower FET 13 are repeated from FIG. 1, and the upper FET is omitted. When FET 13 is turned on, it pulls down the voltage at pad 11, and when FET 13 is turned off, external circuits connected to the pad pull up the pad voltage.

As FIG. 2 shows, the open drain driver with only the lower FET 13 and without the upper FET 14 of FIG. 1 does not provide an ESD current path between pad 11 and Vdd. The external connections that pull up the pad voltage in normal operation of the open drain driver are not a suitable path for this ESD current.

Several variations of the driver circuit of FIG. 2 are well known, and this invention will generally be useful with these variations. Variations of FIG. 2 will be understood without specific explanation, but it will be helpful to point out some specific examples.

As FIG. 3 shows, the driver FET 13 can be implemented as two (or more) stacked FETs 18. FET 13 or FET pair 18 can have either channel conductivity type, and the FETs can be of the type in which the substrate has a back biasing voltage.

The Protection FETs—FIG. 4.

The pad 11 and the lower FET 13 will be familiar from the description of FIG. 2. A field FET 40 is connected between the pad and Vdd, and it will be called the pad to Vdd FET. As will be explained later, FET 40 protects the pad from voltages of either polarity between the pad and Vdd.

As will be explained later, FET 40 has a drain diffusion connected to Vdd and a source diffusion connected to pad 11. In normal operation, the drain-substrate junction is reverse biased and FET 40 does not conduct and does not affect the normal operation of the circuit. During an ESD event, FET 40 can conduct in either direction but the terms drain and source will be used as they have been defined in this paragraph.

When the pad receives a high voltage with respect to Vdd, the source-substrate junction or the drain-substrate junction (depending on the polarity of the pad voltage) is reverse biased, and this junction breaks down and conducts the ESD current. Protection field FET turns on in response to an ESD voltage between the pad and Vdd when this breakdown occurs and it thereby provides an ESD current path between the pad and Vdd.

Optionally, a second field FET 41 is connected between Vss and Vdd, and it will be called the Vss to Vdd FET. When an ESD voltage appears between the pad and Vdd, the ESD voltage may transfer to Vss through FET 13.

Thus, an ESD voltage that turns on pad to Vdd FET 40 will ordinarily also turn on Vss to Vdd FET 41 through the junction breakdown mechanism. The pad to Vdd FET 40 provides one path between the pad and Vdd and FETs 13 and the Vss to Vdd FET 41 cooperate to provide a series ESD current path between the pad and Vdd.

The circuit of FIG. 4 will be understood from a different standpoint when the structure of FETs 13 and 40 has been described.

Figure 5:
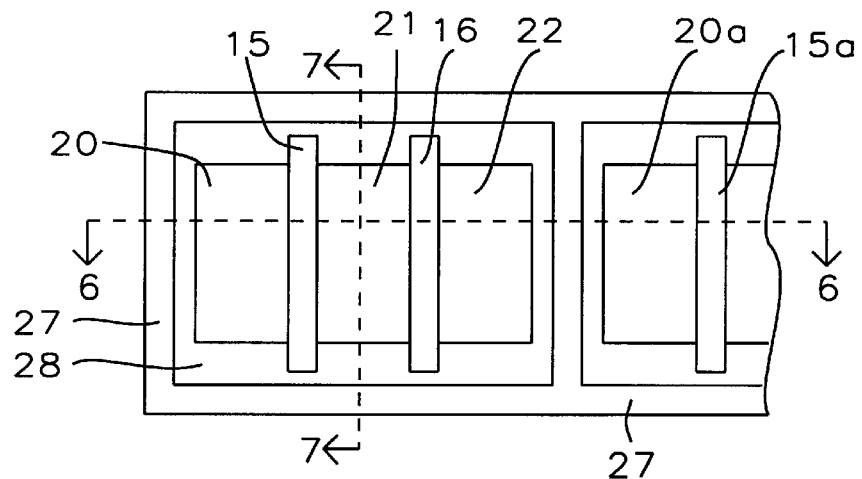
FIG. 5 is a top view of a semiconductor chip embodying the circuit of FIG. 4.

The Cell of FIG. 5

The top view of FIG. 5 shows a structure that will be called a cell. It forms the open drain driver FET 13, the pad to Vdd FET 40, and the Vss to Vdd FET 41 of FIG. 4.

As will be explained later, a driver and the protection FETs 40, 41 will ordinarily comprise an array of these cells, and FIG. 5 shows part of an adjacent cell. The two cells are identical and the reference characters for the two cells are the same except for the subscript "a" in the partial cell.

A cell has two FETs that are formed as a mirror image with a line of symmetry that passes vertically through a diffusion 21 that forms a common drain for the two FETs. The FETs have two gates 15 and 16 and their underlying channels and two source diffusions 20 and 22.

These components form open drain driver 13 in FIG. 4, and they have the connections shown in FIG. 4. The common drain diffusion 21 is connected to the pad 11, the two source diffusions 20, 22 are connected to Vss, and the gates 15, 16 are connected to a source of signals that turn the driver on and off. These connections are made by conductors that run across components 15, 16, 20, 21 and 22 in levels above the uppermost level shown in FIG. 5.

A frame 27 surrounds the two FETs. It is spaced from the components inside the frame by a field oxide 28. Frame 27 is of the same conductivity type as the common drain 21 and the two source diffusions 20 and 22, and as will be explained next, the frame 27 and the oxide 28 cooperate with diffusions inside the frame to form the pad to Vss FET 40 and the Vss to Vdd FET 41.

Because the frames carry some or most of the ESD current, drain diffusions can be made smaller to carry less ESD current.

Thus, the driver and frame of our invention can be made smaller than a driver without the frame. As has been explained already, the smaller driver structure has the advantage that it adds less capicitance to the pad.

Figure 6:
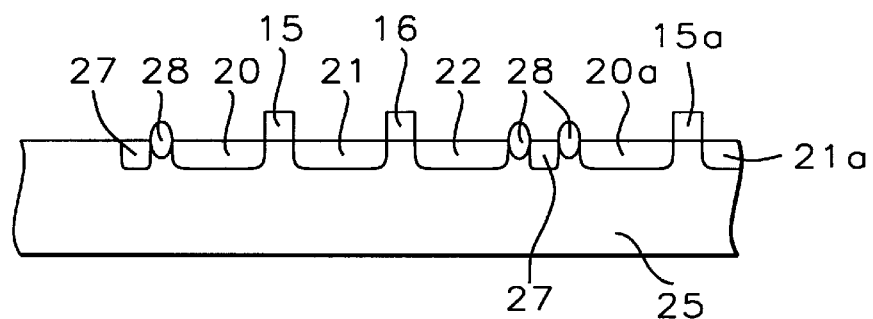
FIG. 6 is a section view along lines 6—6 in FIG. 5.

The Cell Section View of FIG. 6

FIG. 6 shows the mirror structure of FIG. 5 along the horizontal section line 6-6. The common drain diffusion 21, the two gates 15, 16 and the underlying channels, and the source diffusions 20, 21 will be familiar from the description of FIG. 5. The frame 27 and the field oxide 28 are also formed as a mirror structure.

Frame 27 is connected to Vdd. The source diffusions 20 and 21 are connected to Vss and they form the diffusions for the source end of FET 41. The oxide 29 between frame 27 and source diffusions 20 and 22 form part of Vss to Vdd FET 41. In response to an ESD voltage between the pad and Vdd, one of the junctions of FET 13 and one of the junctions of FET 41 (depending on the polarity of the ESD voltage) breaks down conducts an ESD current between the pad and Vdd.

Figure 7:
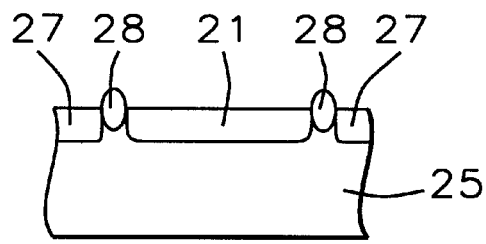
FIG. 7 is a section view along lines 7—7 in FIG. 5.

The Cell Section View of FIG. 7

As FIG. 7 shows, a cell forms pad to Vdd FET 40 between the common drain 21 and the frame 27. The common drain diffusion 21 forms the diffusion for the pad end of field FET 40, and the frame 27 forms the diffusion for the Vdd end of FET 40. When an ESD voltage appears between the pad and Vdd, FET 40 turns on and conducts the ESD current between the pad and Vdd.

Figure 8:
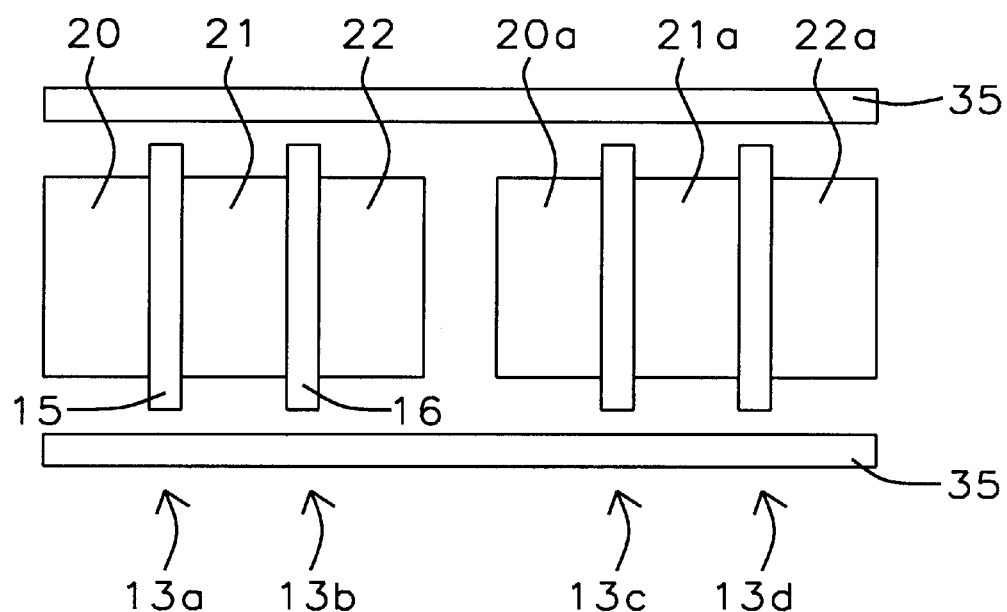
FIG. 8 is a top view similar to FIG. 5 showing another embodiment of the invention.

Alternative Frame Structures —FIG. 8

FIG. 7 shows the driver array structure of FIGS. 5 and 6 extended to four FETs 13a, 13b, 13c, and 13d. The frame comprises a bar 35 across the top of the FETs (in the orientation of the drawing) and a similar bar 35 across the bottom of the FETs. Both frame parts 35 are connected to Vdd, and they operate in the way described earlier for pad to Vdd FET 40. The bars also are near a part of the source diffusions 20 and 22 and may carry some of the ESD current as described for Vss to Vdd FET 41.

When the driver array has more than one row of cells, the cells of adjacent rows can share the intervening frame bar 35. Ordinarily, the driver will have an array that has a few cells in each dimension of the array, for example three or four, as in the related application.

From a different standpoint, in the structure of FIGS. 5, 6, and 7, the FETs of adjacent cells are separated by a segment of frame 27 whereas the corresponding FETs in FIG. 7 do not have this frame part. The bars 35 can be extended to protect a suitable number of drivers.

Another embodiment of the frame will be readily understood from FIG. 7. The frame parts 35 of FIG. 7 are reduced to small islands located near the common drain regions and away from the source diffusions. These islands are connected to Vdd, as has been described for the other frame structures. Vss to Vdd FET 41 is not used in this embodiment.

Figure 9:
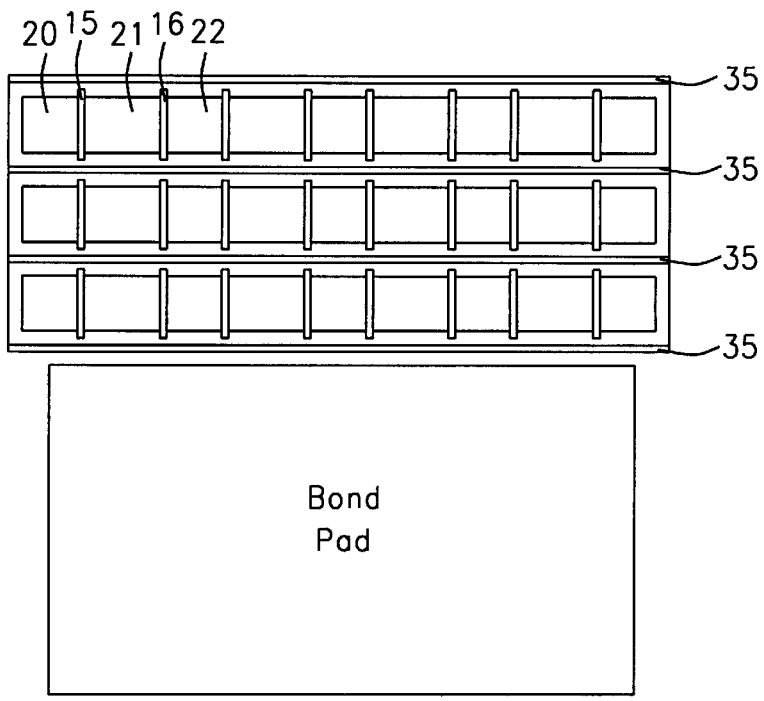
FIG. 9 is a top view showing an array of the cells of FIG. 8.

The Driver Array and Pad to Vdd FET of FIG. 9

In FIG. 8, the bonding pad 11 will be familiar from the earlier description. The driver FET 13 and the pad to Vdd FET 40 are formed as an array of the cells and frame bars shown in FIG. 8. The array has four rows and three columns. The reference characters used in FIG. 5 show the components of one driver cell: the two source diffusions 20, 22, the common drain diffusion 21, and the two gates 15, 16. As has already been explained, the gates are connected to circuits that turn the driver on and off (conventional and not shown), the common drain diffusion 21 is connected to the pad 11, and the frame is connected to Vdd.

FIG. 8 also shows the frame formed as bars 35 that run between each row and along the rows at the top and bottom of the array.

Figure 10:
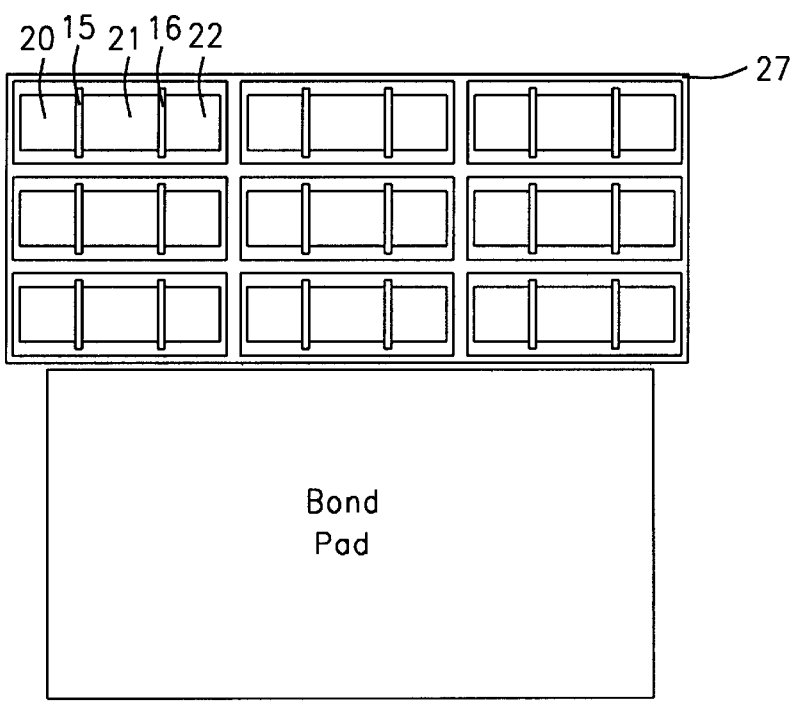
FIG. 10 is a top view similar to FIG. 9 showing an array of the cells of FIG. 5.

The Driver Array and Pad to Vdd FET of FIG. 10

The pad 11, and the array of cells will be readily understood from the preceding description of FIG. 9. In the structure of FIG. 10, each cell has its own frame 21. The frames in this embodiment are spaced apart from the frames of adjacent cells. The frame completely surrounds the cell and cooperates with the drain and source diffusions of the cell to form both the pad to Vdd FET 40 and the Vss to Vdd FET 41.

To generalize the different frame structures that have been described, when FETs 13 and 40 are formed as multiple cells, the frame can be formed in any configuration in which each drain diffusion 21 is associated with a frame part to create field FET 40. To create the Vss to Vdd FET 41, one or preferably both source diffusions 20, 22 are also associated with a frame part to form a field FET.

Other Embodiments

The invention has been described in relation to an NMOS driver formed in a p-type substrate, and the corresponding PMOS driver or n-type substrate will be readily understood without a separate discussion. Those skilled in the art will recognize other modifications of the preferred embodiment within the skill of the art and the intended scope of the claims.

What is claimed is:

1. A circuit for a semiconductor chip, the chip having a plurality of pads where external signal connections can be made to the chip and two power supply points, Vss and Vdd, wherein the improvement comprises, an open drain driver FET having a source diffusion connected to Vss and a drain diffusion connected to the pad, the source and drain diffusions being of a predetermined conductivity type, the driver FET having the property of conducting an ESD current between the pad and Vss and thereby protecting circuits on the chip connected to the pad when an ESD voltage appears between the pad and Vss, a frame of the same conductivity type as the drain and source diffusions formed at least partially around the driver FET and a field oxide between the frame and the source and drain diffusions of the open drain driver, the frame being connected to Vdd, the frame being located with respect to the drain of the driver FET for the drain of the driver FET to form the diffusion for the pad end of a field FET and for the frame to form the Vdd end of the field FET, the field FET having the property of conducting an ESD current between the pad and Vdd and thereby protecting circuits on the chip connected to the pad when an ESD voltage appears between the pad and Vdd.

2. The circuit of claim 1 wherein the frame is formed only partially around the driver FET.

3. The circuit of claim 1 wherein the open drain driver circuit is formed as a source diffusion for a first FET, a source diffusion for a second FET, a drain diffusion common to the first and second FETs, a gate and an underlying channel for the first FET and a gate and an underlying channel for the second FET, means connecting the two source diffusions to Vss, means connecting the common drain diffusion to the pad, and means connecting the two gates to receive a signal for turning the driver on and off.

4. The circuit of claim 3 wherein the driver circuit is formed of an array of cells, each cell comprising the first and second FETs and an associated frame that is formed at least partially around the driver FET.

5. The circuit of claim 4 wherein the array has rows and columns of cells and the frame is a plurality of partial frames located to form a pad to Vdd FET with the common drain of the first and second FETs of each cell.

6. The circuit of claim 5 wherein the partial frame is formed as an island located near the common drain of the first and second FETs of an associated cell.

7. The circuit of claim 6 wherein the partial frame is formed as a bar extending between adjacent rows of the array of cells.

8. The circuit of claim 4 wherein the frame completely surrounds the first and second FET of each cell.

9. The circuit of claim 8 wherein the frame has a common frame part between adjacent cells of the array.

10. The circuit of claim 9 wherein the frame is a complete frame for each cell and separates the cells of adjacent rows and adjacent columns of the array.

11. The circuit of claim 9 wherein the frame and the source diffusions of the first and second FETs of each cell cooperate to form a Vss to Vdd field FET that conducts between Vss and Vdd in series with the driver circuit when an ESD voltage appears between the pad and Vdd.

12. A circuit for a semiconductor chip, the chip having a plurality of pads where external signal connections can be made to the chip and two power supply points, Vss and Vdd, wherein the improvement comprises, a driver FET connected to conduct between the pad and Vss and having the property of turning on in response to an ESD voltage of either polarity between the pad and Vss to clamp the ESD voltage at the pad to a value that protects the internal circuits of the chip which are connected to the pad, the driver FET being formed as an array of FET cells located near the associated pad, each cell having a drain diffusion connected to the pad, at least one source diffusion connected to Vss and at least one gate connected to a source of signals for turning the driver on and off, a frame of the same conductivity type as the drain and source, connected to Vdd and located in a region near the drain diffusion of the associated cell, and a field oxide between the frame and the drain diffusion to form a field FET having the property of turning on in response to an ESD voltage of either polarity between the pad and Vdd to clamp the ESD voltage at the pad to a value that protects the internal circuits of the chip which are connected to the pad.

13. The circuit of claim 12 wherein an FET cell comprises two source diffusions and two gates formed symmetrically about a common drain diffusion.

14. The circuit of claim 13 wherein the frame is formed as bars running along the rows of the array.

15. The circuit of claim 14 wherein one edge of the array is closely adjacent to one edge of the pad and wherein the bars run parallel to these edges.

16. The circuit of claim 15 wherein a bar runs between said edge of the pad and said edge of the array.

17. The circuit of claim 13 wherein the frame is formed completely around each FET cell.

18. The circuit of claim 17 wherein a field oxide is formed between the frame and the source diffusions to form a field FET having the property of turning on in response to an ESD voltage of either polarity between the Vss and Vdd to conduct with the driver FET to clamp the ESD voltage at the pad to a value that protects the internal circuits of the chip which are connected to the pad.

* * * * *